May 21, 1963 W. ENGEL 3,090,926

TRANSISTOR AMPLIFIER WITH TUNNEL DIODE IN EMITTER CIRCUIT

Filed July 13, 1961

United States Patent Office 3,090,926
Patented May 21, 1963

3,090,926

TRANSISTOR AMPLIFIER WITH TUNNEL DIODE IN EMITTER CIRCUIT

Walter Engel, Nurnberg, Germany, assignor to Siemens-Schuckertwerke Aktiengesellschaft, Berlin-Siemensstadt and Erlangen, Germany, a corporation of Germany Filed July 13, 1961, Ser. No. 123,867
Claims priority, application Germany July 15, 1960
3 Claims. (Cl. 330—24)

Figure 1:
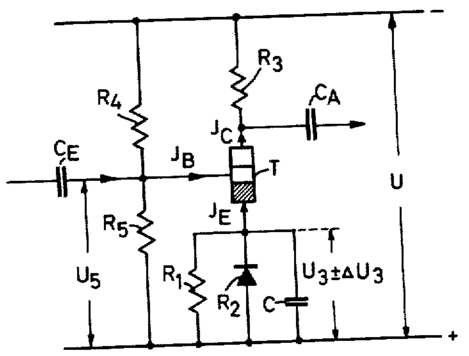

My invention relates to a transistor amplifier of an extremely low supply voltage, for example 3 volts and less, which is provided with a negative current feedback coupling in the emitter circuit for stabilizing the working point on the transistor characteristic relative to variations in temperature. Amplifiers of this kind are preferably employed for small portable appliances that are self-contained with respect to their energy source, such as portable radio receivers, hearing aids, and other small appliances that contain their own current source in form of one or more dry cells or storage batteries.

In the known transistor amplifiers of this type the current feedback coupling in the emitter circuit of the transistor consumes an appreciable portion of the operating voltage. The thermal stability of the amplifier being the better, the larger the voltage drop at the feedback coupling. At the extremely low supply voltage, however, the permissible voltage drop is extremely limited, the knee voltage of the transistor forming part of the inevitable additional losses.

It is an object of my invention to improve the efficiency of such a low-voltage transistor amplifier by reducing the voltage drop at the feedback coupling in the emitter circuit, particularly for use of such transistors in small self-energized appliances such as hearing aids, portable and automobile radios or the like.

According to my invention, the above-mentioned negative feedback coupling in the emitter circuit of the transistor amplifier consists of a composite resistance member that comprises an ohmic resistor in parallel connection with a tunnel diode of such mutual adaptation that at the working point of the amplifier the linear current-voltage characteristic of the ohmic resistance intersects the current-voltage characteristic in the negative portion thereof. This affords the advantage of a very small voltage drop of only about 0.1 to 0.2 v. in conjunction with a high dynamic resistance in the kilo-ohm order of magnitude. A good frequency characteristic of the amplifier stage is thus obtainable with small parallel capacitance values.

The invention will be further described with reference to the drawing showing in FIG. 1 an example of an amplifier circuit according to the invention and in FIG. 2 the current-voltage characteristic of the same amplifier circuit.

In the embodiment shown in FIG. 1, a transistor T is connected to respective direct-current leads of low supply voltage U. That is, the collector of the transistor is connected through a collector resistor $R_3$ to the minus lead and the emitter is connected to a resistive feedback member with the plus lead. The feedback coupling consists of an ohmic resistor $R_1$ in parallel connection with a tunnel diode whose resistance is denoted by $R_2$, and in parallel connection with a capacitor C. The base of the transistor is connected through an input capacitor $C_E$ to a signal current or voltage input (not illustrated). The base is further connected to a current of a voltage divider which is formed by two series connected resistors $R_4$ and $R_5$ between the negative and positive voltage supply leads. The output signal is taken from between the collector and the collector resistor $R_3$ through a capacitor $C_A$. The operation of such an amplifier is known as such and, with the exception of the matters described presently, does not differ in principle from the known transistor amplifiers.

Figure 2:
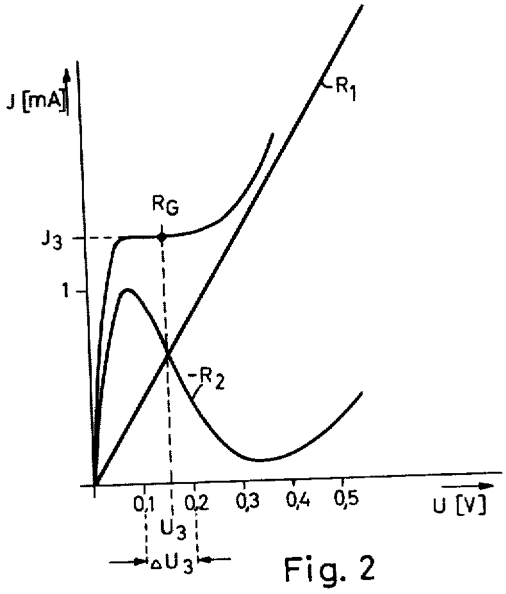

In order to stabilize the working point of the amplifier on the transistor characteristic, the resistors $R_1$ and $R_2$ are so matched that the intersection P of their respective current-voltage characteristics is located in the negative portion of the tunnel-diode characteristic as shown in FIG. 2. This working point is determined by the current value $J_3$ and the voltage value $U_3$. For maintaining controllability of the amplifier circuit, the resistors $R_4$ and $R_5$ whose ratio $R_4/R_5$ is determined by the working point P of the tunnel diode $R_2$ and transistor are so rated that the base current is at least equal to the ratio of the operating voltage U to the sum of the voltage-divider resistors $R_4$ and $R_5$. That is $$J_B \geq \frac{U}{R_4+R_5}$$

Since the emitter current $J_E=J_3$ (FIG. 2), with $J_3$ being the current at the working point; and since further $J_E=J_B+J_C$, the following equation can be set up:

$$U_{BE} \pm \Delta U_{BE} - U_5 - U_3 \pm \Delta U_3 = 0$$

In this equation, $U_{BE}$ denotes the voltage between emitter and base of transistor T, and $\Delta U_{BE}$ denotes the change in voltage for a change of the working point. The magniture $\Delta U_{BE}$ is proportional to the temperature, and the magnitude $\Delta U_3$ is proportional to the heat dissipation. Slow changes in temperature do not affect the base current $J_B$ and hence do not change the collector current $J_C$. Since the resistance $$R_G = \frac{R_1 \cdot R_2}{R_1 - R_2}$$

is made large, the value of capacitor C can be kept small without increase in the lower limit frequency $$f_u = \frac{1}{R_G C}$$

The following numerical values and particular component types for the above-described circuit are presented by way of example. It should be understood that these may be modified in proper correlation to one another depending upon the requirements or preferences of any particular application.

A single Leclanché-element providing 1.5 volts represents the supply U. The transistor T is a Valvo type OC59. The tunnel diode $-R_2$ is the General Electric model ZJ56.

According to the General Electric specification sheet for a ZJ56 tunnel diode $-g=.01$ mho; hence $$-R_2 = 100 \text{ ohms}$$

The operating point upon the tunnel diode static characteristic is chosen so that:

$$R_1 - R_2 = 0$$

hence $$R_1 = 100 \text{ ohms}$$

and $$J_E = J_3 = 2 \times 0.6 \text{ ma.} = 1.2 \text{ ma.}$$

and $$U_3 = 0.15 \text{ volt}$$

According to the manufacturer's data sheet for General Electric tunnel diode ZJ56, the point .15 volt, 0.6 ma. lies in the midpoint of the descending branch in the tunnel diode static characteristic curve. This location allows for a rise and fall of the applicable temperature.

According to the manufacturer's specification sheet for Valvo transistor type OC59, $$J_b=\alpha_b\cdot J_E=\frac{\alpha_e}{1+\alpha_e}\cdot J_E=\frac{80}{81}\cdot J_E\approx J_E$$

$$R_3=\frac{U-U_3-U_{CE}}{J_E}$$

For maximum control range, $$J_E\cdot R_3-U_{CE}=0$$

hence $$R_3=\frac{U-U_3-J_ER_3}{J_E}$$

$$2R_3=\frac{U-U_3}{J_E}$$

$$R_3=\frac{U-U_3}{2_{JE}}=\frac{1.35}{2.4\times10^{-3}}=560\text{ ohms}$$

For these conditions in the transistor T, $J_B=7.5$ microamperes, $$(R_4+R_5)J_B=U$$

$$R_4\cdot 2J_B\approx 2U_{CE}$$

hence $$U_{CE}+R_5\cdot J_B=U$$

$$R_5=\frac{U-U_{CE}}{J_B}=\frac{J_ER_3+U_3}{J_b}$$

$$=\frac{(1.2\times10^{-3})(.56\times10^3)+.15}{7.5\times10^{-6}}$$

$$R_5=\frac{820}{7.5\cdot10^{-3}}=110{,}000\text{ ohms}$$

$$R_4=\frac{U}{J_B}-R_5=\frac{1.5}{7.5\times10^{-6}}-110\times10^3$$

$$R_4=90{,}000\text{ ohms}$$

It will be obvious that the invention may be embodied in structures other than those particularly described herein without departing from the essential features of my invention and within the scope of the claims annexed hereto.

I claim:

1. A transistor amplifier, comprising two voltage supply leads, a transistor having an emitter circuit connected to one of said leads, a collector circuit connected to said other lead, a negative feedback coupling connected in said emitter circuit and comprising an ohmic resistor and a tunnel diode connected in parallel to said resistor, said tunnel diode having a current-voltage characteristic with a negative portion, and said resistor having a linear current-voltage characteristic matched to said tunnel diode characteristic so as to intersect said negative portion, a base on said transistor for receiving an input signal voltage applied to said base and said feedback coupling.

2. A low-voltage amplifier, comprising voltage supply leads having a voltage below 3 volts, a transistor having an emitter circuit connected to one of said leads, a collector circuit connected to said other lead, and a base conductor for applying a signal voltage between said base conductor and said one lead, a negative feedback coupling connected in said emitter circuit and comprising an ohmic resistor and a tunnel diode connected in parallel to said resistor, said tunnel diode having a current-voltage characteristic with a negative portion, and said resistor having a linear current-voltage characteristic matched to said tunnel diode characteristic so as to intersect said negative portion.

3. A transistor amplifier, comprising two voltage supply leads, a transistor having an emitter circuit connected to one of said leads, a collector circuit connected to said other lead, and a base conductor for applying a signal voltage between said base conductor and said one lead, a negative feedback coupling connected in said emitter circuit and comprising an ohmic resistor and a tunnel diode connected in parallel to said resistor, said tunnel diode having a current-voltage characteristic with a negative portion, and said resistor having a linear current-voltage characteristic matched to said tunnel diode characteristic so as to intersect said negative portion, a voltage divider having two resistors serially connected between said two supply leads and having a circuit point between said two resistors connected to said base conductor, said two latter resistors having respective resistance magnitudes rated in accordance with the condition $$J_B\geq\frac{U}{R_4+R_5}$$

wherein $J_B$ is the base current, U is the voltage of said supply leads and $R_4$, $R_5$ are the ohmic resistance values of said latter two resistors.

No references cited.

Disclaimer 3,090,926.—*Walter Engel*, Nurnberg, Germany. TRANSISTOR AMPLIFIER WITH TUNNEL DIODE IN EMITTER CIRCUIT. Patent dated May 21, 1963. Disclaimer filed Aug. 26, 1965, by the inventor; the assignee, *Siemens-Schuckertwerke Aktiengesellschaft*, consenting.

Hereby enters this disclaimer to claim 1 of said patent.

[*Official Gazette December 14, 1965.*]